United States Patent

[11] 3,603,329

[72] Inventors Robert B. White;
Charles L. Cooke, both of Huntsville, Ala.
[21] Appl. No. 781,686
[22] Filed Nov. 6, 1968
[45] Patented Sept. 7, 1971
[73] Assignee Brown Engineering Company, Inc.
Continuation of application Ser. No. 468,435, June 30, 1965, now abandoned.

[54] APPARATUS FOR MANUFACTURING PRINTED CIRCUITS
4 Claims, 1 Drawing Fig.

[52] U.S. Cl. .......... 134/107, 118/63, 134/131, 134/199, 228/20
[51] Int. Cl. .......... B08b 3/02
[50] Field of Search .......... 134/72, 73, 107, 122, 129, 131, 151; 117/102; 118/63, 64, 302, 316; 228/20; 29/487

[56] References Cited

UNITED STATES PATENTS

| | | | |
|---|---|---|---|
| 1,617,096 | 2/1927 | Bell et al. | 134/131 X |
| 3,082,774 | 3/1963 | Benton et al. | 134/151 X |
| 3,213,472 | 10/1965 | Cocchiaraley et al. | 134/131 X |
| 3,298,588 | 1/1967 | Shomphe | 228/20 |

*Primary Examiner*—Robert L. Bleutge
*Attorney*—Beveridge & DeGrandi

ABSTRACT: Apparatus for obtaining a thin, smooth and evenly distributed layer of solder covering the entire conductive area of a printed circuit board by passing a circuit board, in which the conductive area is coated with a layer of solder, through a spray of liquid heated to above the melting point of the solder.

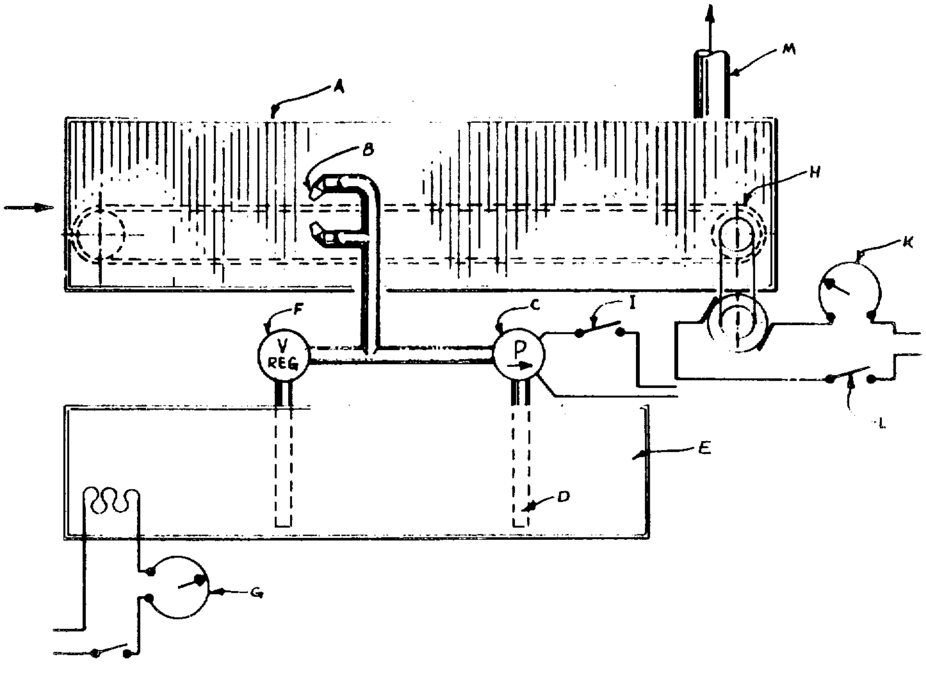
INVENTORS
[signatures]

APPARATUS FOR MANUFACTURING PRINTED CIRCUITS

This application is a continuation of application Ser. No. 468,435, filed June 30, 1965, which is now abandoned.

The present invention relates to a novel apparatus for manufacturing printed circuits of superior qualities.

The object of our invention is to make printed circuits of a completely smooth, leveled surface, which offers several advantages in applying the terminals of electric circuitry.

In the conventional methods a protective film is applied to a copper foil, the circuit pattern transferred to this film, followed by removal of excessive parts of the film and of copper foil. Finally any solder is applied to the remaining copper pattern. This cover of solder is of special importance, since it has to provide reliable electrical contact and conductivity to the printed circuits. However, in the conventional methods this cover of solder is lumpy and frequently contains inclusions of flux and oxides, and many a malfunction is caused by these drawbacks. This may be remedied by the present invention which will now be described in more detail.

A chromate-gelatine film is applied to a copper foil which, in turn, is bonded to a plastic base such as paper base phenoplast or polyvinyl chloride. Next a photographic negative of the pattern is superimposed on the film, followed by exposure to ultraviolet light. Then the nonexposed parts of the film are dissolved with alcohol or methanol. Subsequently the unprotected parts of copper are etched away by means of ferric chloride or nitric acid. Following this, the remainder of hardened protective film is likewise removed by any solvent. Instead of the photoetching method described, the pattern may likewise be applied by stencil etching, e.g., silk screening, whereby any lacquer or enamel may be used to make up a protective film, followed by etching excessive copper.

Following this printed circuit board is freed from oxides and other impurities and the board is then dried. Now any soldering flux, e.g., rosin flux is applied with heating up to approximately 150° F. Then a solder, consisting of 63 percent tin and 37 percent lead is applied to the entire copper surface, the solder applied to the entire copper surface of this example has a melting point of between 360° F. and 370° F.

The final modifying and leveling of the solder coatings may be performed in an apparatus, as shown in the attached drawing.

A shows the casing with access door. B illustrates a spray nozzle manifold, comprising, for instance, 14 nozzles. About 10 gallons of any oil at 440° F. is passed through the spray nozzles per min., and the printed circuit boards are simultaneously passed through the sprays of nozzles B, whereby the sprays form an angle of impact of between 40° and 70° with an optimum being about 60°. The printed circuit boards are traveling from the left to the right side, by means of a conveyor H with a speed of between 1 and 3 inches per second with an optimum being 1.5 inches per second. The hot oil is circulated by pump C and intake D whereby the oil is being heated in vessel E, and its flow is controlled by means of bypass F. The temperature of the oil is controlled by rheostat G. Spray on-off is operated by switch I, conveyor on-off is operated by switch L, while its speed is controlled by rheostat K. M shows a chimney for the exhaust gases.

The details and figures, presented above, are given by way of example only and should not involve any restriction to the scope of the present invention.

We claim:

1. Apparatus for producing a thin, evenly distributed protective solder coating over the entire conductive area of a printed circuit board comprising an enclosed compartment, an exhaust gas vent line from the interior of said compartment, a conveyor movable horizontally through the interior of said compartment and adapted to support a plurality of solder coated circuit boards with the conductive area exposed and positioned in a horizontal plane for movement along a substantially horizontal path through said compartment, power means for continuously moving said conveyor and supported boards along said path in a given direction, means for containing a volume of superheated fluid and maintaining it at a temperature exceeding 360° F. and substantially above the melting point of the solder applied to the circuit board, a plurality of spray nozzles arranged within said compartment along a line transversely of said path with the nozzles aligned to have the spray therefrom vertically inclined at an acute angle to and along the axis of said path in a direction opposite that of said conveyor motion, a conduit connecting said liquid containing means and said nozzles, and a pumping means associated with said conduit for pumping the 360° F. temperature exceeding fluid through said conduit to exit as a spray from said nozzles, whereby said heated liquid from the spray melts the solder coating and the impact thereof evenly distributes the melted solder into a smooth and level film covering the entire conductive area.

2. The apparatus of claim 1 wherein the discharge from said nozzles is directed at an angle of between 40° and 70° to the line of movement of said conveyor.

3. The apparatus described in claim 2 wherein said nozzles are arranged in two groups with one group being positioned above the conveyor and the other group being positioned below the conveyor such that the spray from both groups is directed onto said path at substantially the same angle.

4. The apparatus described in claim 3 wherein said lower group of nozzles lie directly vertically below said upper group with the discharge of both groups of nozzles intercepting said path substantially along a common line.